United States Patent
Jachowski et al.

(10) Patent No.: US 12,308,824 B2
(45) Date of Patent: *May 20, 2025

(54) RESONATOR CIRCUIT USING AN INVERTER TO ADJUST ANTI-RESONANCE FREQUENCY

(71) Applicant: Murata Manufacturing Co., Ltd., Nagaokakyo (JP)

(72) Inventors: Douglas Jachowski, Santa Cruz, CA (US); Gregory L. Hey-Shipton, Santa Barbara, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 490 days.

This patent is subject to a terminal disclaimer.

(21) Appl. No.: 17/712,011

(22) Filed: Apr. 1, 2022

(65) Prior Publication Data

US 2022/0231662 A1    Jul. 21, 2022

Related U.S. Application Data

(63) Continuation of application No. 16/700,158, filed on Dec. 2, 2019, now Pat. No. 11,323,094.

(51) Int. Cl.
| | |
|---|---|
| *H03H 9/205* | (2006.01) |
| *H02M 7/44* | (2006.01) |
| *H03H 7/01* | (2006.01) |
| *H03H 9/64* | (2006.01) |

(52) U.S. Cl.
CPC .............. *H03H 9/205* (2013.01); *H02M 7/44* (2013.01); *H03H 7/0161* (2013.01); *H03H 9/6483* (2013.01)

(58) Field of Classification Search
CPC .............. H03H 9/17; H03H 9/205; H03H 9/64
See application file for complete search history.

(56) References Cited

U.S. PATENT DOCUMENTS

| | | | | |
|---|---|---|---|---|
| 5,499,002 | A * | 3/1996 | Kinsman ................. | H03H 9/542 333/195 |
| 5,933,062 | A * | 8/1999 | Kommrusch ........ | H03H 9/6483 333/193 |
| 7,429,900 | B2 * | 9/2008 | Nunokawa ............... | H03B 5/32 331/116 R |
| 7,683,742 | B2 * | 3/2010 | Cathelin ................... | H03J 3/20 333/213 |
| 8,701,065 | B1 * | 4/2014 | Silver ..................... | H03H 9/465 716/132 |
| 9,705,473 | B2 * | 7/2017 | David ....................... | H03H 7/38 |
| 10,326,428 | B2 * | 6/2019 | Ellä ......................... | H03H 9/568 |
| 10,476,478 | B2 * | 11/2019 | Schmidhammer ... | H03H 9/0004 |
| 10,852,331 | B2 * | 12/2020 | Silver ................... | G01R 23/167 |
| 11,323,094 | B2 * | 5/2022 | Jachowski ............. | H03H 9/542 |

* cited by examiner

*Primary Examiner* — Andrea Lindgren Baltzell
*Assistant Examiner* — Alan Wong
(74) *Attorney, Agent, or Firm* — ArentFox Schiff LLP

(57) ABSTRACT

Networks and filters are disclosed. A network includes a resonator that exhibits both a resonance and an anti-resonance and an inverter circuit connected in parallel with the resonator to form a composite resonator. An anti-resonant frequency of the composite resonator is different from the resonator's anti-resonant frequency.

18 Claims, 5 Drawing Sheets

©2019 RESONANT INC.

US 12,308,824 B2

RESONATOR CIRCUIT USING AN INVERTER TO ADJUST ANTI-RESONANCE FREQUENCY

RELATED APPLICATION INFORMATION

This patent is a continuation of application Ser. No. 16/700,158, filed Dec. 2, 2019 entitled RESONATOR CIRCUIT USING AN INVERTER TO ADJUST ANTI-RESONANCE FREQUENCY which claims priority from the provisional patent application 62/773,893, filed Nov. 30, 2018, entitled INVERTER ADJUSTMENT OF ANTI-RESONANCE FREQUENCY OF ACOUSTIC RESONATOR.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low insertion loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is less than a defined value such as one dB, two dB, or three dB. A "stop-band" may be defined as a frequency range where the insertion loss of a filter is greater than a defined value such as twenty dB, twenty-five dB, forty dB, or greater depending on application.

RF filters are used in communications systems where information is transmitted over wireless links. For example, RF filters may be found in the RF front-ends of base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, less noise, less distortion, less interference, etc. These improvements can be realized at many levels of the wireless system both separately and in combination, for example at the RF module, RF transceiver, mobile or fixed sub-system, or network levels.

Throughout this description, elements appearing in figures are assigned three-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figures 1A, 1B:
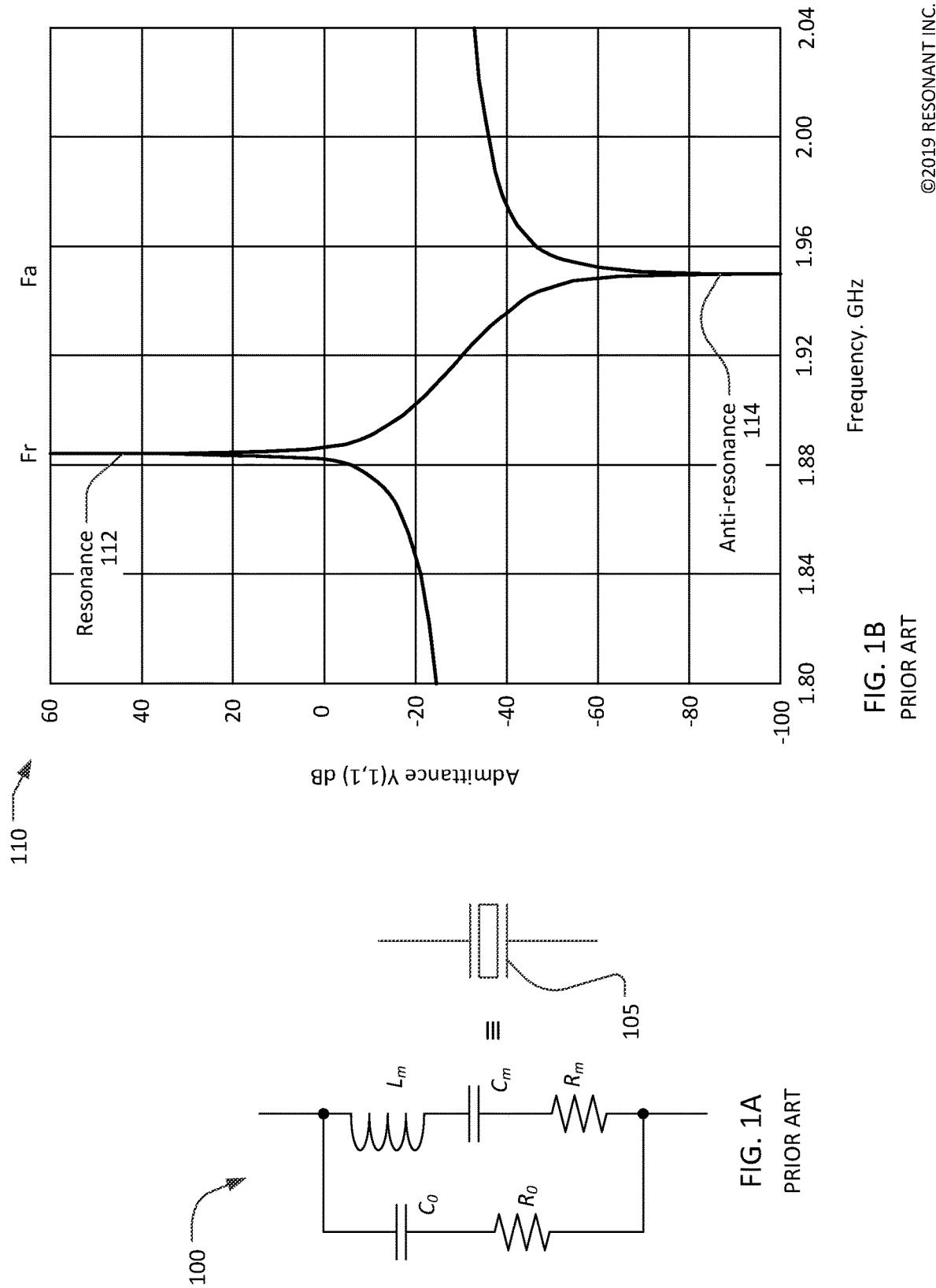
FIG. 1A is a commonly used equivalent circuit of a resonator that exhibits both a resonance and an anti-resonance.
FIG. 1B is a graph of the admittance of a lossless resonator modeled using the equivalent circuit of FIG. 1A.

Resonators that exhibit both a resonance and an anti-resonance, such as acoustic wave resonators, and more specifically surface acoustic wave resonators (SAWs), bulk acoustic wave (BAW) resonators, and film bulk acoustic wave (FBAW) resonators, are commonly used in radio frequency filters for communications devices. The admittance between the input and output terminals of an acoustic wave resonator is highly frequency-dependent. The basic behavior of acoustic wave resonators is commonly described using the Butterworth Van Dyke (BVD) circuit model as shown in FIG. 1A. The BVD circuit model consists of a motional arm and a static arm. The motional arm includes a motional inductance $L_m$, a motional capacitance $C_m$, and a motional resistance $R_m$. The static arm includes a static capacitance $C_0$ and a static resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports and with multiple pass-bands).

The first primary resonance of the BVD model is the motional resonance modeled by the series combination of the motional inductance $L_m$, the motional capacitance $C_m$ and the motional resistance $R_m$. The second primary resonance of the BVD model is the anti-resonance modeled by the series combination of the motional inductance $L_m$, the motional capacitance $C_m$ and the motional resistance $R_m$ in parallel with the series combination of the static capacitance $C_0$ and the static resistance $R_0$. In a lossless resonator ($R_m=R_0=0$), the frequency $F_r$ of the motional resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

where $\gamma = C_0/C_m$ is a characteristic of the substrate upon which the SAW resonator is fabricated. $\gamma$ is dependent on both the material and the orientation of the crystalline axes of the substrate, as well as the physical design of the resonator.

In subsequent figures, each resonator will be represented by the symbol 105 and modeled using the equivalent circuit 100.

FIG. 1B is a plot of the magnitude of the admittance of a theoretical lossless (i.e. $R_0=Rm=0$) acoustic resonator represented by a BVD model. The admittance exhibits a motional resonance 112 where the admittance of the resonator approaches infinity, and an anti-resonance 114 where the admittance of the resonator approaches zero. In oversimplified terms, the lossless acoustic resonator can be considered a short circuit at the frequency $F_r$ of the motional resonance 112 and an open circuit at the frequency $F_a$ of the anti-resonance 114. The frequencies of the motional resonance 112 and the anti-resonance 114 are representative, and a resonator may be designed for other resonant and anti-resonant frequencies.

Figure 2:
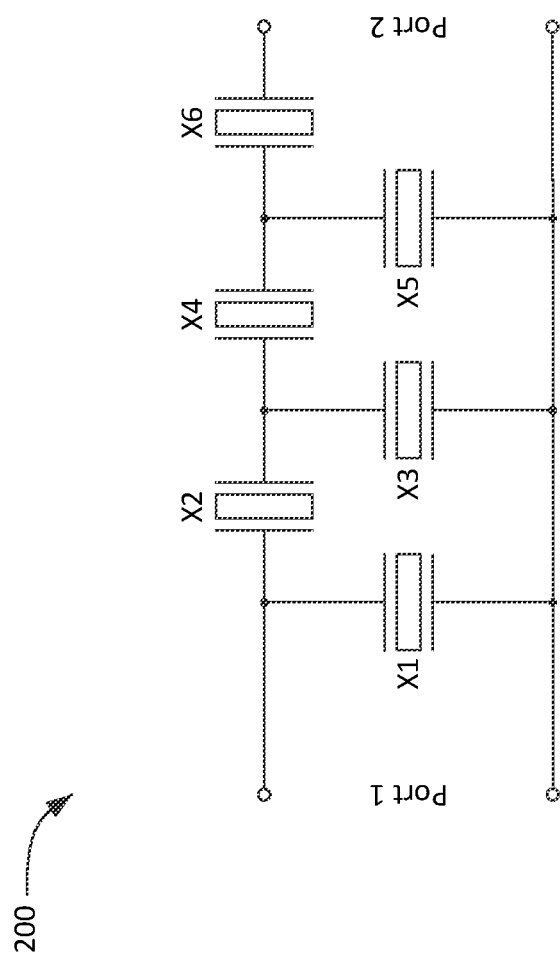
FIG. 2 is a schematic diagram of an exemplary band-pass filter circuit incorporating resonators modeled using the equivalent circuit of FIG. 1A.

FIG. 2 shows a simplified schematic circuit diagram of an exemplary band-pass filter circuit 200 incorporating six acoustic wave resonators, labeled X1 through X6, arranged in what is commonly called a "ladder" configuration. The filter circuit 200 may be, for example, a transmit filter or a receive filter for incorporation into a communications device. The filter circuit 200 includes three series resonators (X2, X4, and X6) connecting a first port (Port 1) and second port (Port 2). By definition, series resonators are connected in series to form an unbroken signal path from the first port to the second port. Either port may be the input or the output of the filter circuit. The filter circuit 200 includes three shunt resonators (X1, X3, and X5). Each shunt resonator is connected between ground and one of a junction of adjacent series resonators, the input of the filter, and the output of the filter. The schematic diagram of FIG. 2 is simplified in that passive components, such as the inductances inherent in the conductors interconnecting the resonators, are not shown. The use of six acoustic wave resonators, three series, and three shunt resonators is exemplary. A band-pass filter circuit may include more than, or fewer than, six resonators and more than, or fewer than, three series resonators and three shunt resonators, and need not have a "ladder" configuration.

Each acoustic wave resonator X1 to X6 may be a bulk acoustic wave (BAW) resonator, a film bulk acoustic wave (FBAW) resonator, a surface acoustic wave (SAW) resonator, a temperature compensated surface acoustic wave resonator (TC-SAW), a transversely-excited film bulk acoustic resonator (XBAR) as described in application Ser. No. 16/230,443, a solidly-mounted transversely-excited film bulk acoustic resonator (SM-XBAR) as described in application Ser. No. 16/438,141, or some other type of mechanical or acoustic wave resonator. All of the acoustic wave resonators X1 to X6 are typically, but not necessarily, the same type of resonator.

As shown in FIG. 1B, each acoustic wave resonator X1 to X6 exhibits very high admittance at a resonance frequency and very low admittance at an anti-resonance frequency higher than the resonance frequency. In simplified terms, each resonator may be considered a short circuit at its resonance frequency and an open circuit at its anti-resonance frequency. Thus the transmission between Port 1 and Port 2 of the band-pass filter circuit 200 is very low at the resonance frequencies of the shunt resonators X1, X3, X5 and the anti-resonance frequencies of the series resonators X2, X4, X6. In a typical ladder band-pass filter, the resonance frequencies of shunt resonators are less than a lower edge of the filter passband to create a stop-band at frequencies below the passband. The anti-resonance frequencies of shunt resonators typically fall within the passband of the filter. Conversely, the anti-resonance frequencies of series resonators are greater than an upper edge of the passband to create stop-band at frequencies above the passband. The resonance frequencies of series resonators typically fall with the passband of the filter. In some designs, one or more shunt resonators may have resonance frequencies higher than the upper edge of the passband.

Figure 3:
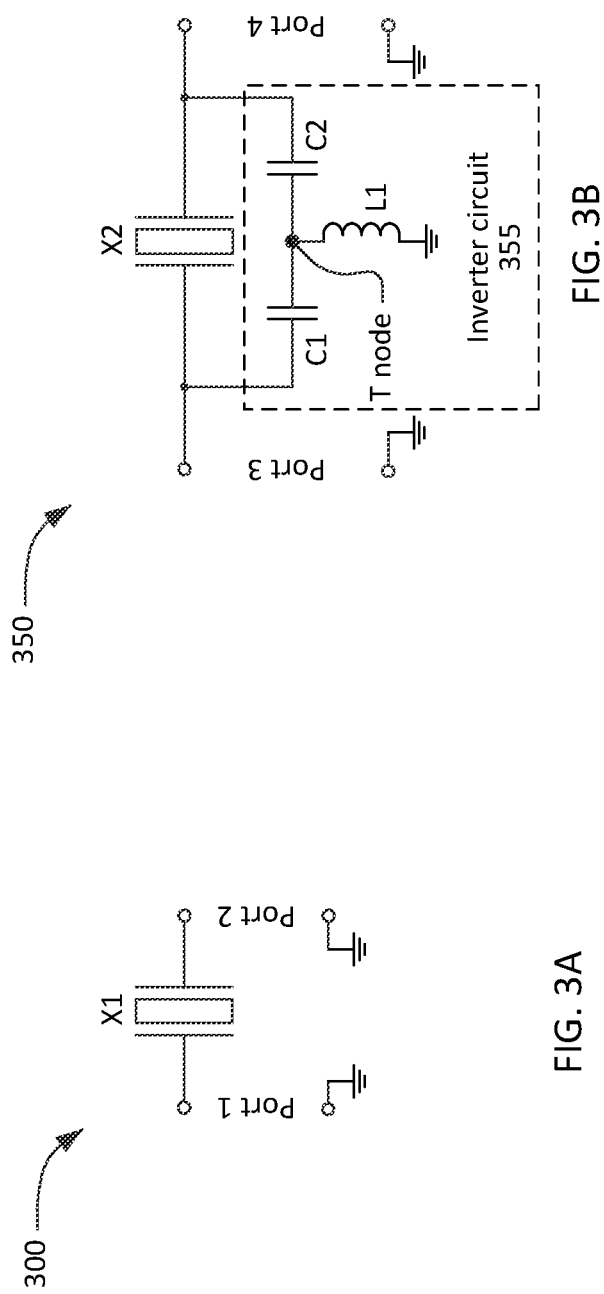
FIG. 3A is a schematic diagram of a two-port network including a single resonator modeled using the equivalent circuit of FIG. 1A.
FIG. 3B is a schematic diagram of a two-port network of a composite resonator including a resonator modeled using the equivalent circuit of FIG. 1A and an inverter circuit.

FIG. 3A is a schematic diagram of a two-port network 300 consisting of a single resonator X1. The resonator X1 may be an acoustic wave resonator as previously described or any other resonator that can be modeled using the BVD circuit of FIG. 1A. The two-port network 300 is essentially a ladder filter with a single series resonator. $|S_{2,1}|^2$, which is the transmission from port 1 to port 2 of the network, will be maximum at the resonance frequency of X1 and minimum at the anti-resonance frequency of X1.

While the relationship of the resonance and anti-resonance frequency of the resonator X1 in isolation is fixed by the physical characteristic of the resonator, this relationship can be modified using passive components external to the resonator. For example, connecting a reactance (i.e. a capacitor or inductor) in parallel with a resonator will change the anti-resonance frequency relative to the resonance frequency. In some situations, it may be desirable to change or eliminate the anti-resonance frequency of a resonator with respect to its resonance frequency without modifying the physical characteristics of the resonator. For example, raising the anti-resonance frequency of a series resonator in a filter may allow a wider filter bandwidth or better attenuation in a stop band above the passband of the filter. In other situations, it may be desirable to eliminate the anti-resonance of a resonator entirely.

FIG. 3B is a schematic diagram of another two-port network 350 that constitutes a composite resonator including the resonator X1, capacitors C1 and C2, and inductor L1. In this context a "composite resonator" is a circuit including a resonator and one or more reactive components configured such that one or both of a resonant frequency and an anti-resonant frequency of the composite resonator is different from the resonant frequency and an anti-resonant frequency of the resonator in isolation. In the two-port network 350, capacitor C1 is connected between one terminal of the resonator X1 and a node identified as the "T node". This node is conveniently termed the "T node" since it is disposed at the intersection of a "T" shaped circuit formed by capacitors C1 and C2 and inductor L1. Capacitor C2 is connected between the second terminal of the resonator X1 and the T node. Inductor L1 is connected between the T node and ground. Capacitors C1 and C2 and inductor L1 form an "inverter" or "impedance inverter" circuit 355 that, for some range of frequencies, has an effect similar to connecting a virtual capacitor with a negative effective capacitance in parallel with resonator X1. The notional negative effective capacitance provided by the inverter circuit is additive with the static capacitance $C_0$ of the resonator, thereby effecting the anti-resonance of the composite resonator.

Figure 4:
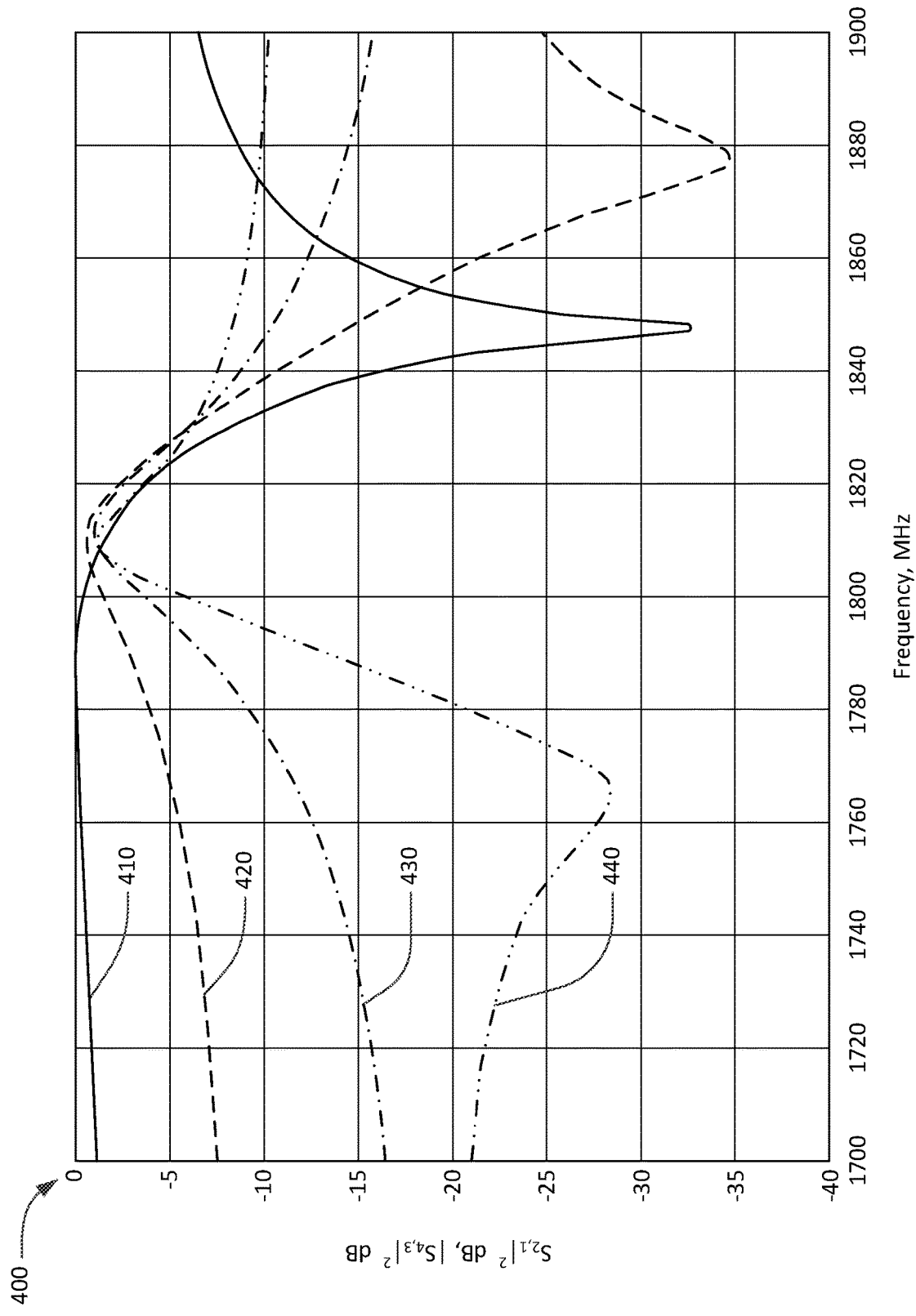
FIG. 4 is a graph of the transmission through the two-port networks of FIG. 3A, and FIG. 3B.

FIG. 4 is a graph of the transmission through the two-port network 300 of FIG. 3A and three example embodiments of the two-port network 350 of FIG. 3B. The transmission of each two-port network was calculated using a circuit simulation tool. In all cases, the resonator has a resonant frequency of 1785 MHz and a static capacitance $C_0$ of 1 picofarad (pF). The motional capacitance $C_m$ is about 0.071 pF, the motional inductance $L_m$ is about 111.3 nanohenries (nH). The static resistance $R_0$ is about 0.74 ohms and the motional resistance $R_m$ is about 1.04 ohms. The other component values for each of the embodiments are provided in the table below.

|  | Line in FIG. 4 | C1/C2 pF | L1 nH |
| --- | --- | --- | --- |
| FIG. 3A | 410 | — | — |
| FIG. 3B Ex. 1 | 420 | 1.25 | 1 |
| FIG. 3B Ex. 2 | 430 | 1.97 | 1 |
| FIG. 3B Ex. 3 | 440 | 3 | 1 |

In FIG. 4, the solid line 410 is a plot of $|S_{2,1}|^2$, which is the transmission through the two-port network 300, which consists of the single resonator X1. Transmission is maximum at the resonance frequency of the resonator (about 1785 MHz). Transmission is minimum at the anti-resonance frequency of the resonator (about 1843 MHz).

Example 1

The dashed line 420 is a plot of $|S_{4,3}|^2$, which is the transmission through a first example embodiment of the two-port network 350. In this example, the inverter circuit 355 is configured to increase anti-resonant frequency of the composite resonator by about 25 MHz compared to the resonator in isolation (line 410).

Example 2

The dot-dash line 430 is a plot of $|S_{4,3}|^2$, the transmission for a second example embodiment of the two-port network 350. In this example, the inverter circuit 355 is configured to provide a larger increase to the anti-resonant frequency of the composite resonator to a value outside of the plotted frequency range. As the anti-resonance of the composite resonator is moved to an arbitrarily high frequency, it is effectively eliminated. The line 430 exhibits a maximum transmission at a frequency about 1810 MHz with nearly symmetrical transmission characteristics to either side of the transmission maximum.

Example 3

The dot-dot-dash line 440 is a plot of $|S_{4,3}|^2$, the transmission for a third example embodiment of the network 350. In this example, the inverter circuit 355 is configured to move the anti-resonant frequency of the composite resonator through infinity to below the resonant frequency. This results in a transmission minimum at a frequency about 1765 MHz, which is below the frequency of the transmission maximum.

The use of an inverter circuit as shown in FIG. 3B allows independent control of the anti-resonance of a composite resonator beyond what is sometimes practical using a passive reactance in parallel with the resonator. The use of an inverter circuit to independently control the frequency of the antiresonance of a resonator is not limited to the preceding examples and is not limited to the frequency range used for these examples.

Figure 5:
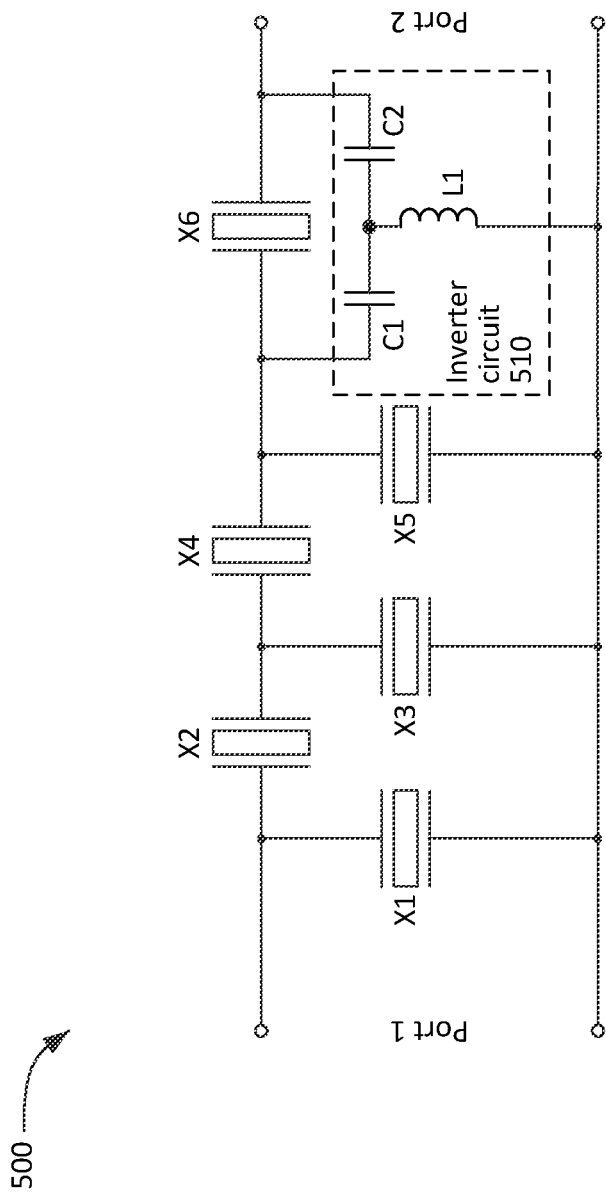
FIG. 5 is a schematic diagram of an exemplary band-pass filter circuit incorporating resonators modeled using the equivalent circuit of FIG. 1A and an inverter circuit.

FIG. 5 shows a simplified schematic circuit diagram of an exemplary band-pass filter circuit 500 incorporating six acoustic wave resonators, labeled X1 through X6, arranged in a "ladder" configuration. The filter circuit 500 is generally the same as the filter circuit 200 with the addition of an inverter circuit 510 to provide a negative capacitance in parallel with series resonator X6. An inverter circuit may be connected to any or both of series resonators X2 and X4 instead of, or in addition to, the inverter circuit 510. A filter incorporating an inverter circuit may have more or fewer than six resonator and typically include at least one series resonator connected to the inverter circuit, at least one additional series resonator and at least one shunt resonator.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A composite resonator comprising:
a resonator, exhibiting a resonance and an anti-resonance, the resonator having a first terminal and a second terminal; and
an inverter circuit connected in parallel with the resonator, the inverter circuit consisting of:
a T-node;
a first capacitor having a first terminal directly connected to the first terminal of the resonator without any passive components disposed therebetween, and further having a second terminal directly connected to the T-node;
a second capacitor having a first terminal directly connected to the second terminal of the resonator without any passive components disposed therebetween, and further having a second terminal directly connected to the T-node; and
an inductor directly connected between the T-node and a ground connection.

2. The composite resonator of claim 1, wherein the inverter circuit is configured to set an anti-resonant frequency of the composite resonator to be different from an anti-resonant frequency of the resonator in isolation.

3. The composite resonator of claim 2, wherein the inverter circuit is configured to set the anti-resonant frequency of the composite resonator to be greater than the anti-resonant frequency of the resonator in isolation.

4. The composite resonator of claim 2, wherein the inverter circuit is configured to set the anti-resonant frequency of the composite resonator to be less than a resonant frequency of the resonator in isolation.

5. The composite resonator of claim 1, wherein the resonator is an acoustic wave resonator.

6. The composite resonator of claim 5, wherein the resonator is a first series resonator within a ladder filter circuit including at least a second series resonator and one or more shunt resonators.

7. The composite resonator of claim 1, wherein a same third voltage is across both the inverter circuit and the resonator circuit.

8. A filter comprising:
a plurality of resonators including a first series resonator that exhibits both a resonance and an antiresonance, the first series resonator having a first terminal and a second terminal; and
an inverter circuit connected in parallel with the first series resonator, the inverter circuit consisting of:
a T-node;
a first capacitor having a first terminal directly connected to the first terminal of the first series resonator without any passive components disposed therebetween, and further having a second terminal directly connected to the T-node;
a second capacitor having a first terminal directly connected to the second terminal of the first series resonator without any passive components disposed therebetween, and further having a second terminal directly connected to the T-node; and
an inductor directly connected between the T-node and a ground connection,
wherein the first terminal of the first series resonator has a first same voltage as the first terminal of the first capacitor, and wherein the second terminal of the first series resonator has a same second voltage as the second terminal of the second capacitor.

9. The filter of claim 8, wherein an anti-resonant frequency of the first series resonator in parallel with the inverter circuit is greater than the anti-resonant frequency of the first series resonator in isolation.

10. The filter of claim 8, wherein an anti-resonant frequency of the first series resonator in parallel with the inverter circuit is less than the resonant frequency of the first series resonator in isolation.

11. The filter of claim 8, wherein all of the plurality of resonators are acoustic wave resonators.

12. The filter of claim 11, wherein some of the plurality of resonators are shunt resonators.

13. The filter of claim 8, wherein a same third voltage is across both the inverter circuit and the first series resonator circuit.

14. A band-pass filter comprising:
a plurality of resonators connected in a ladder filter circuit, the plurality of resonators including a first series resonator that exhibits both a resonance and an antiresonance and at least one shunt resonator, the first series resonator having a first terminal and a second terminal; and
an inverter circuit connected in parallel with the first series resonator, the inverter circuit consisting of:
a T-node;
a first capacitor having a first terminal directly connected to the first terminal of the first series resonator without any passive components disposed therebetween, and further having a second terminal directly connected to the T-node;
a second capacitor having a first terminal directly connected to the second terminal of the first series resonator without any passive components disposed therebetween, and further having a second terminal directly connected to the T-node; and
an inductor directly connected between the T-node and a ground connection.

15. The band-pass filter of claim 10, wherein all of the plurality of resonators are acoustic wave resonators.

16. The band-pass filter of claim 14, wherein an anti-resonant frequency of the first series resonator in parallel with the inverter circuit is greater than the anti-resonant frequency of the first series resonator in isolation.

17. The band-pass filter of claim 14, wherein an anti-resonant frequency of the first series resonator in parallel with the inverter circuit is less than the resonant frequency of the first series resonator in isolation.

18. The band-pass filter of claim 14, wherein a same third voltage is across both the inverter circuit and the first series resonator circuit.

* * * * *